(12) United States Patent
Henry et al.

(10) Patent No.: US 7,070,446 B2
(45) Date of Patent: Jul. 4, 2006

(54) STACKED SFP CONNECTOR AND CAGE ASSEMBLY

(75) Inventors: Randall R. Henry, Harrisburg, PA (US); Michael J. Phillips, Camp Hill, PA (US)

(73) Assignee: Tyco Electronics Corporation, Middletown, PA (US)

( * ) Notice: Subject to any disclaimer, the term of this patent is extended or adjusted under 35 U.S.C. 154(b) by 284 days.

(21) Appl. No.: 10/649,238

(22) Filed: Aug. 27, 2003

(65) Prior Publication Data

US 2005/0037655 A1 Feb. 17, 2005

(51) Int. Cl.
*H01R 13/60* (2006.01)

(52) U.S. Cl. ............................................. 439/541.5
(58) Field of Classification Search ........... 439/541.5, 439/607–10, 352, 939, 108, 138, 752, 79, 439/676

See application file for complete search history.

(56) References Cited

U.S. PATENT DOCUMENTS

| | | | |
|---|---|---|---|
| 5,531,612 A | | 7/1996 | Goodall et al. ......... 439/541.5 |
| 5,879,173 A | * | 3/1999 | Poplawski et al. ......... 439/138 |
| 5,961,350 A | * | 10/1999 | Shiu ........................ 439/607 |
| 6,095,862 A | * | 8/2000 | Doye et al. ................ 439/607 |
| 6,206,725 B1 | | 3/2001 | Wu ........................ 439/541.5 |
| 6,276,963 B1 | | 8/2001 | Avery et al. ............. 439/541.5 |
| 6,517,382 B1 | * | 2/2003 | Flickinger et al. ......... 439/607 |
| 2002/0025720 A1 | | 2/2002 | Bright et al. ............... 439/607 |
| 2002/0146926 A1 | | 10/2002 | Fogg et al. ................ 439/362 |
| 2002/0197043 A1 | | 12/2002 | Hwang et al. ............. 385/134 |

FOREIGN PATENT DOCUMENTS

DE 196 40 847 A1 4/1998

* cited by examiner

*Primary Examiner*—J. F. Duverne

(57) ABSTRACT

An electrical connector assembly is shown having a stamped and formed shielded cage having a plurality of ports for receiving SFP modules. The cages have an opening extending through a lower face thereof for receiving a header connector having first and second extensions which are aligned with the first and second columnar ports in the cage. Thus, the SFP modules are pluggable into individual ports, whereby two modules are interconnected to a single header connector interconnected to a motherboard.

26 Claims, 18 Drawing Sheets

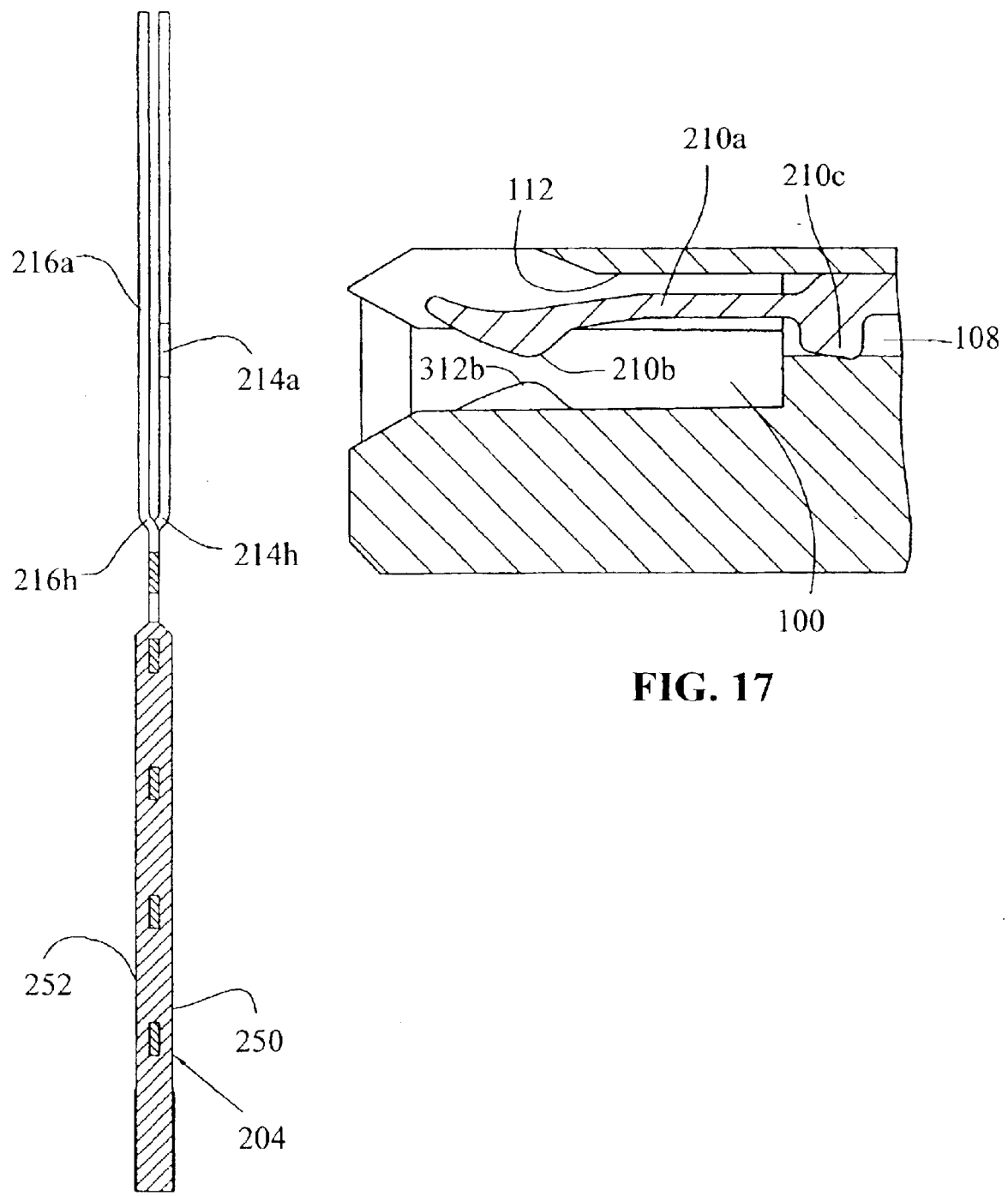

STACKED SFP CONNECTOR AND CAGE ASSEMBLY

FIELD OF THE INVENTION

The present invention relates generally to electronic connector systems and, more specifically, to low-profile connector systems for pluggable electronic modules, such as transceiver modules for high speed fiber optical and copper communications.

BACKGROUND OF INVENTION

It is known to provide a metal cage with a plurality of ports, whereby SFP modules are pluggable therein. Such modules are similar to that disclosed in U.S. Pat. No. 6,517,382. In fact, several pluggable module designs and standards have been introduced in which a pluggable module plugs into a receptacle which is electronically connected to a host circuit board. For example, a well-known type of transceiver developed by an industry consortium is known as a gigabit interface converter (GBIC) or serial optical converter (SOC) and provides an interface between a computer and a data communication network such as Ethernet or Fibre Channel. These standards offer a generally robust design which has been well received in industry.

Although these conventional pluggable designs have been used successfully in the past, they tend to be unsuitable for miniaturization which is an ever-constant objective in the industry. It is desirable to miniaturize transceivers in order to increase the port density associated with the network connection, such as, for example, switch boxes, cabling patch panels, wiring closets, and computer I/O. Recently, a new standard has been promulgated and is referred to herein as the small form factor pluggable (SFP) standard which specifies an enclosure height of 9.8 mm and a width of 13.5 mm and a minimum of 20 electrical input/output connections. In addition to miniaturizing the module, it is also desirable to increase its operating frequency. For example, applications are quickly moving from the sub-gigabit realm to well over a gigabit. Conventional pluggable module configurations, however, cannot meet these parameters. It is also desirable to increase the port density and optimize the connection interface for the SFP modules.

Miniaturizing a module while maintaining or even increasing its operating speed, presents a number of design problems particularly in applications in which data transmission rates are high, e.g., in the range of 1–10 Gbs (Gigabits/second). Of particular concern is reducing electromagnetic interference (EMI) emissions. Due to FCC regulations, there is a need not only to minimize the EMI emissions of the module, but also to contain the EMI emissions of the host system in which the module is mounted regardless of whether a module is plugged in to the receptacle.

In conventional designs, this EMI shielding was achieved by using conductive spring-loaded door which was capable of swinging shut and closing the receptacle when the module was removed. Conventional receptacles also had spring clips to ground the receptacles to the bezel opening of the host system. Providing space for spring-loaded doors and spring clips on the receptacle tends to be problematic if not impossible in miniaturized configurations. Additionally, the small size presents problems in dissipating heat from the module and incorporating traditional mechanisms for ejecting and retaining the module and for electrically connecting the module to the host circuit board.

Therefore, there is a need for a connection system design that conforms to the SFP standard while minimizing EMI emissions, increase port density and provide convenient pluggable operation. The present invention fulfills this need among others.

SUMMARY OF THE INVENTION

The objects have been accomplished by providing an electrical connector, comprising an insulative housing having an upstanding body, having a lower printed circuit receiving face and a mating face. The mating face comprises upper and lower printed circuit card receiving slots, where the receiving slots extend horizontally across the face, and are positioned one above the other. A terminal array is comprised of a stamped lead frame overmolded with a web of plastic material, and each array comprises upper and lower terminals pairs, with an upper pair comprised of cantilever beam contacts flanking the upper printed circuit card receiving slot, and a lower pair comprised of cantilever beam contacts flanking the lower printed circuit card receiving slot. The terminals within the pairs are positioned proximate each other, and the pairs are spaced apart from each other by a vertical spacing. Each terminal of the lower pair has an intermediate portion transitioning into a printed circuit board portion, and each terminal of the upper pair has an intermediate portion transitioning into an extension portion, and then into the printed circuit board portion.

The connector housing includes upper and lower extensions which extend from a body portion of the connector housing to the front mating face, the upper and lower printed circuit card receiving slots being positioned in respective upper and lower extensions. The connector body portion defines a recessed face, intermediate the upper and lower extensions. The overmolded web of material is substantially rectangular in configuration, having a front vertical edge positioned with the upper and lower pair of cantilevered beam contacts extending outwardly from the front edge, and a lower horizontal edge having the printed circuit board contacts extending outwardly therefrom. The cantilever beam contacts of the upper and lower pairs are laterally staggered relative to each other, and extend laterally staggered over the upper and lower printed circuit card receiving slots.

The connector also comprises a locking tab overmolded in the web of material, the locking tab being positioned in the vertical spacing, and extends outwardly from the front edge thereof, the locking tab engaging a slot in the recessed face of the housing. The locking tab is formed from the same material as the stamped lead frame, but is stamped free from the terminals.

The connector housing includes a cavity behind the recessed face and the upper and lower extensions, to receive a plurality of stacked terminal arrays. The overmolded web of material includes substantially planar side surfaces, to allow the stacking of the terminal arrays. The connector further comprises cooperative aligning elements on adjacent stacked terminal arrays. The cooperative elements are defined by a cooperative dovetail being positioned on the adjacent stacked terminal arrays, which are received in receiving slots formed on an upper surface of the cavity.

In an alternate embodiment, an electrical connector assembly comprises a shielding cage comprised of a plurality of ports defined in an array of a plurality of rows and columns. The shielding cage has a front mating face, side walls, a top wall, a rear wall, and a partially extending lower wall and intermediate wall, forming a communication opening between a column of vertical ports. An electrical connector comprises an insulative housing having an upstanding body, the electrical connector is receivable in the communication opening and has a lower printed circuit receiving face and a mating face, the mating facing comprising upper and lower printed circuit card receiving slots. The receiving slots extend horizontally across the face, and are positioned one above the other, and each are generally aligned with one of the ports in the column, and a plurality of terminals defined in an array, with each array comprising upper and lower terminals pairs, with an upper pair comprised of cantilever beam contacts flanking the upper printed circuit card receiving slot, and a lower pair comprised of cantilever beam contacts flanking the lower printed circuit card receiving slot.

The assembly further comprises a plurality of pluggable modules, receivable in at least some of the ports, the module having a printed circuit card adjacent a pluggable end of the modules and being positionable with the slots and engageable with the terminal pairs, and an interface connector at a front end, the interface connector being accessible through the port when the module is plugged in, the interface connector and the printed circuit card being electrically interconnected.

The terminal array is comprised of a stamped lead frame overmolded with a web of plastic material, each array comprising upper and lower terminals pairs, with an upper pair comprised of cantilever beam contacts flanking the upper printed circuit card receiving slot, and a lower pair comprised of cantilever beam contacts flanking the lower printed circuit card receiving slot. The terminals within the pairs are positioned proximate each other, and the pairs are spaced apart from each other by a vertical spacing, and each terminal of the lower pair has an intermediate portion transitioning into a printed circuit board portion; and each terminal of the upper pair has an intermediate portion transitioning into an extension portion, and then into the printed circuit board portion.

The connector housing includes upper and lower extensions which extend from a body portion of the connector housing to the front mating face, the upper and lower printed circuit card receiving slots are positioned in respective upper and lower extensions. The body portion defines a recessed face, intermediate the upper and lower extensions. The overmolded web of material is substantially rectangular in configuration, having a front vertical edge positioned with the upper and lower pair of cantilevered beam contacts extending outwardly from the front edge, and a lower horizontal edge having the printed circuit board contacts extending outwardly therefrom. The cantilever beam contacts of the upper and lower pairs are laterally staggered relative to each other, and extend laterally staggered over the upper and lower printed circuit card receiving slots.

The connector further comprises a locking tab overmolded in the web of material, the locking tab being positioned in the vertical spacing, and extends outwardly from the front edge thereof, the locking tab engaging a slot in the recessed face of the housing. The locking tab is formed from the same material as the stamped lead frame, but is stamped free from the terminals.

The connector housing includes a cavity behind the recessed face and the upper and lower extensions, to receive a plurality of stacked terminal arrays. The overmolded web of material includes substantially planar side surfaces, to allow the stacking of the terminal arrays. The connector further comprises cooperative aligning elements on adjacent stacked terminal arrays. The cooperative elements are defined by a cooperative dovetail being positioned on the adjacent stacked terminal arrays, which are received in receiving slots formed on an upper surface of the cavity.

BRIEF DESCRIPTION OF THE DRAWINGS

FIG. 13 shows a cross-sectional view through lines 13—13 of FIG. 11;

FIG. 17 shows a partial cross-sectional view through lines 17—17 of FIG. 16;

DETAILED DESCRIPTION OF THE EMBODIMENT

Figure 1:
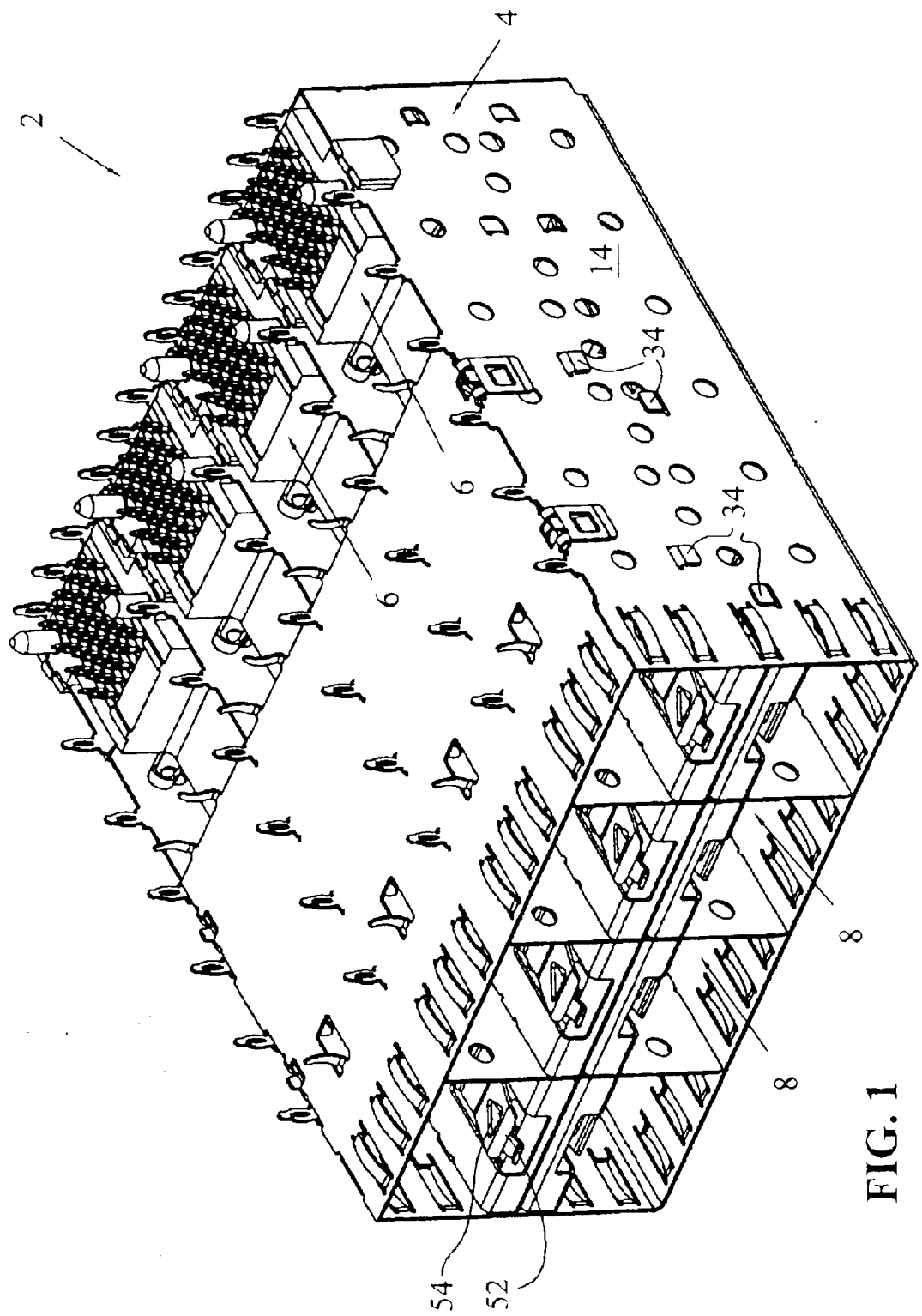
FIG. 1 is a perspective view from an underside of the electrical connector assembly showing the cage and electrical connectors.
Figure 2:
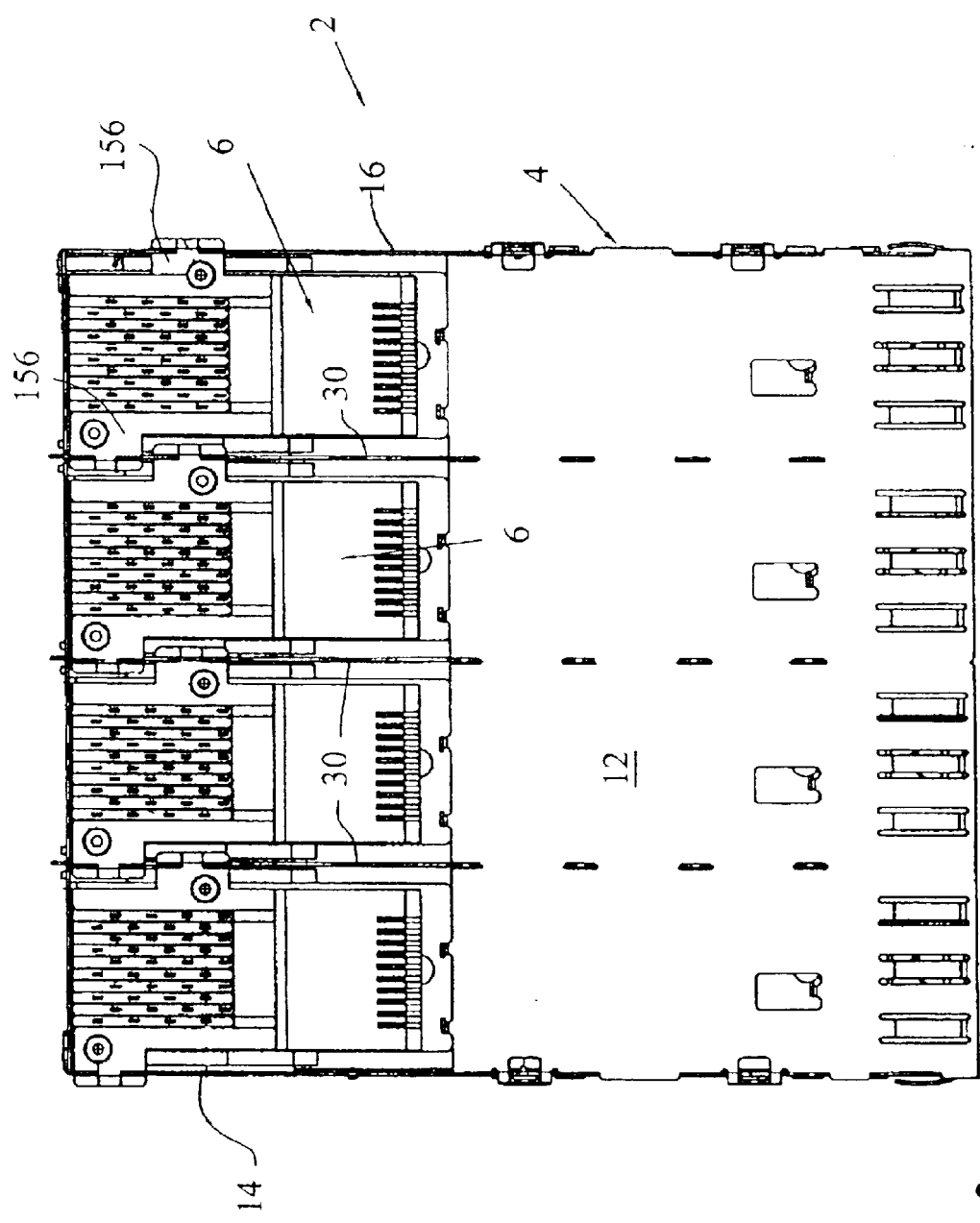
FIG. 2 is a bottom plan view of the assembly of FIG. 1.

With reference first to FIGS. 1 and 2, an electrical connector assembly is shown generally at 2, which comprises a shielded, stamped and formed cage member 4 including a plurality of connector assemblies 6 positioned therein. It should be appreciated from FIG. 1 that the connector assembly is intended for placement on a motherboard and includes a plurality of ports 8 for receipt of modules, as will be described herein.

Figure 3:
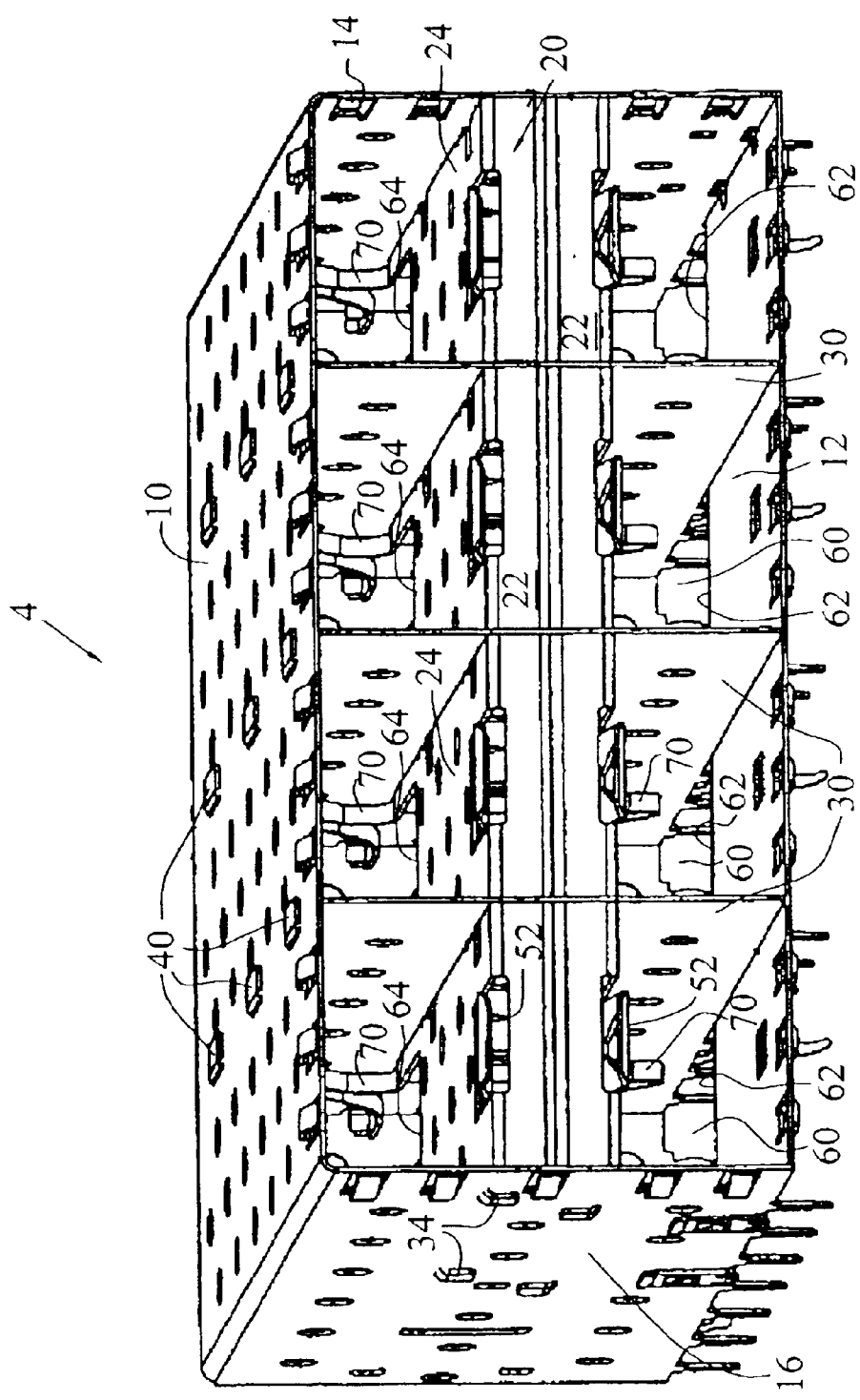
FIG. 3 is a front perspective view of the cage of FIG. 1 less the connectors.
Figure 4:
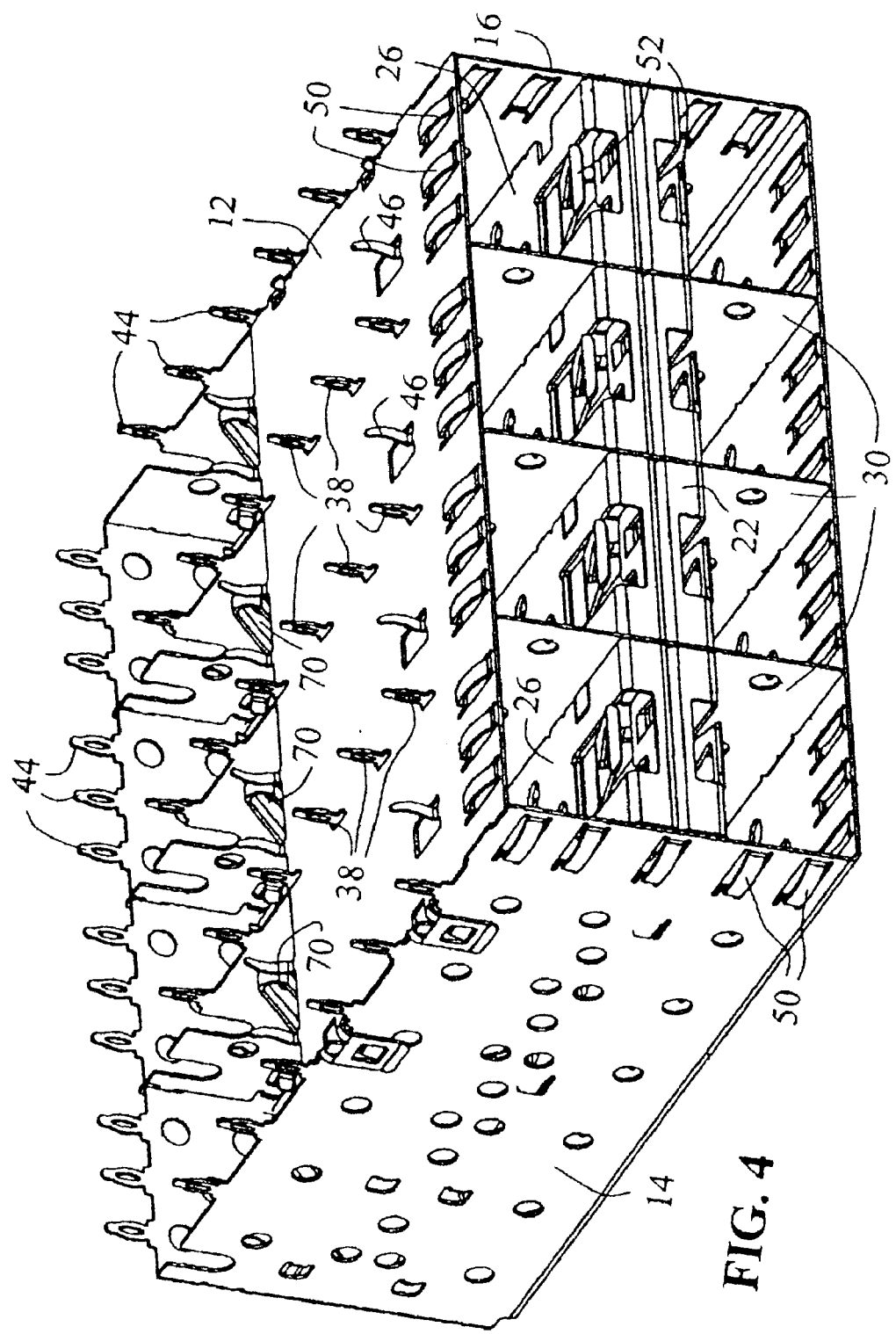
FIG. 4 is an underside perspective of the cage assembly FIG. 3.

As shown in FIGS. 3 and 4, the cage member 4 is shown less the electrical connectors 6, and is shown generally comprised of a top wall 10, a lower wall 12, side walls 14 and 16, which together define the general enclosure for cage member 4. The cage member 4 is subdivided into rows by way of a center separator member 20, having a front face portion at 22 with an upper wall 24 (FIG. 3) and a lower wall 26 (FIG. 4). Meanwhile, the cage 4 is divided into columns by way of vertically extending divider walls at 30. It should be appreciated that the center separator member 20 is retained in place by tabs 34, which extend from side edges of the upper and lower walls 24, 26, and which extend through the side walls 14, 16, as best shown in FIGS. 1 and 3. The vertical dividers 30 are positioned and retained to the upper and lower plates 10, 12 by way of printed circuit board tines 38 (FIG. 4) extending through apertures of the lower plate 12 and by way of bent-over tab portions 40 (FIG. 3) which extend through apertures in the upper plate portion 10.

The cage member 4 has numerous features allowing the grounding of the cage to a motherboard and/or a further panel. As shown best in FIG. 4, in addition to printed circuit board tines 38, the perimeter of the cage housing includes a plurality of printed circuit board tines at 44, which are profiled to both mechanically hold the cage to a motherboard as well as to ground the cage thereto. Resilient tongues 46 are also struck from lower wall 12 and provide grounding of the cage to the motherboard. Around the perimeter of the cage towards the front edge thereof, the cage includes a plurality of resilient tongues 50, which are profiled to engage an edge of an opening through which the cage is inserted. The walls 24 and 26 include grounding tabs 52 adjacent a front edge thereof for grounding a module to be inserted therein. Finally, the grounding tabs have latching openings 54, as will be more fully described herein.

With reference now to FIG. 3, the cage member 4 also includes a communication opening, generally designated by reference numeral 60 and which is formed by opening 62 extending through lower wall member 12 (FIG. 3), through-opening 64 through divider wall 24 (FIG. 3), and through a corresponding opening similar to opening 64, which extends through wall 26 (not shown). The communication opening 60 extends through lower wall 12 and through intermediate walls 24, 26 at the rearward side thereof for access to connector member 6, as will be described in further detail.

Finally, with respect to FIGS. 3 and 4, the cage also includes module kick-out springs 70, which are defined by a reversely bent loop of stamped and formed material, which is defined into a forwardly directed spring.

Figure 5:
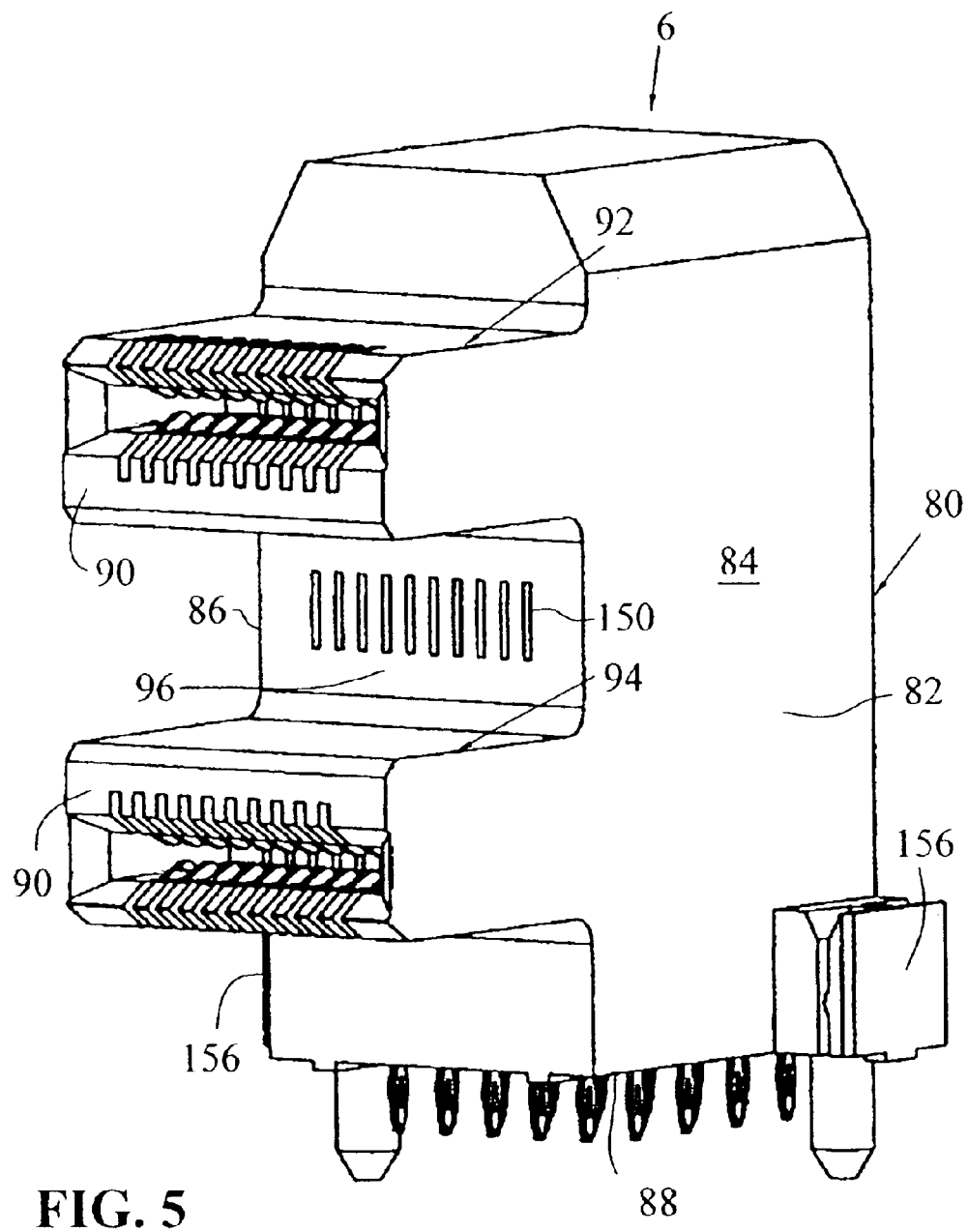
FIG. 5 is a perspective view of the connector shown in FIG. 1.
Figure 6:
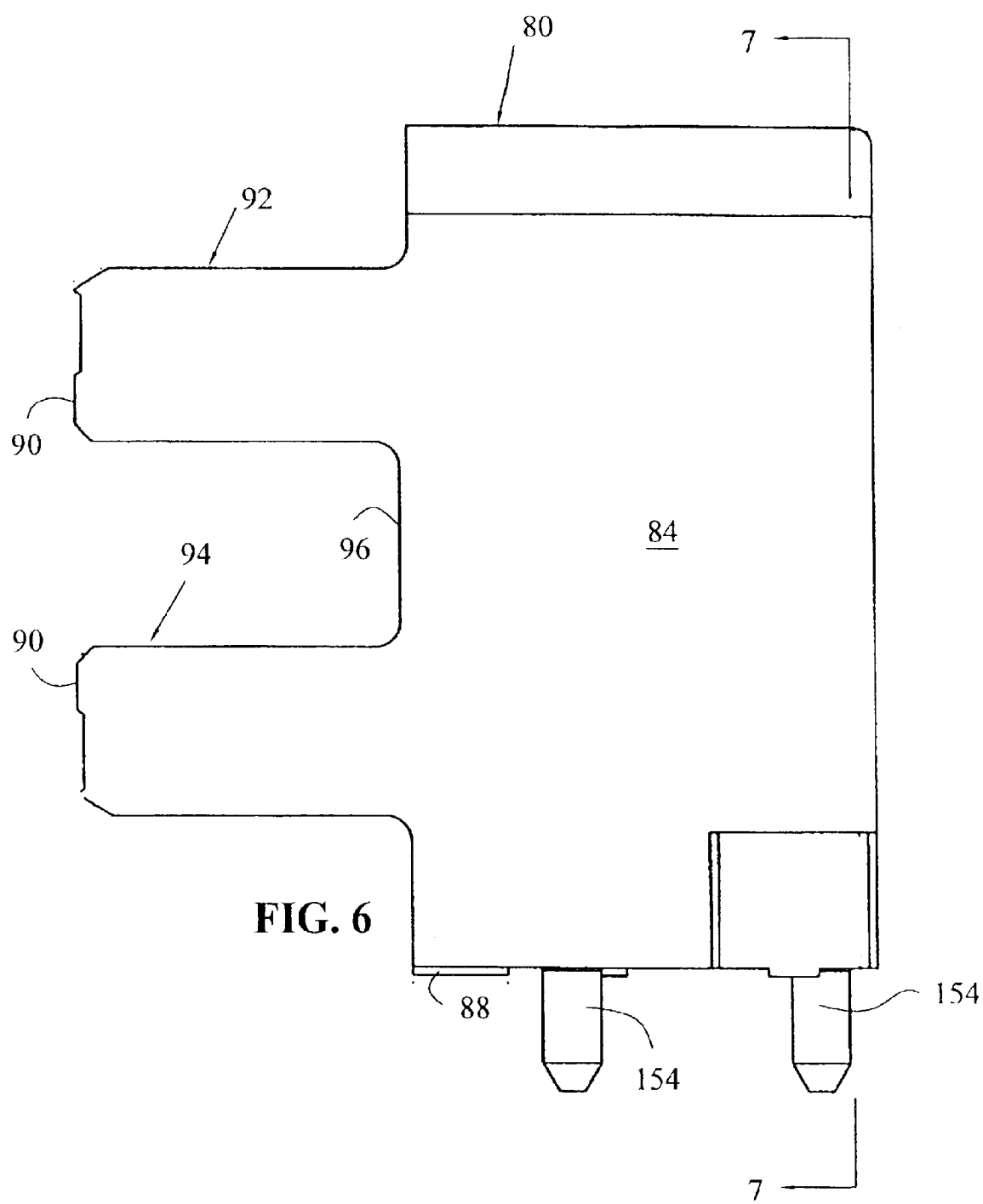
FIG. 6 is a side plan view of the connector shown in FIG. 5.

With respect now to FIGS. 5 through 9, connector 6, and more particularly, the housing 80, will be described in further detail. As best shown in FIG. 5, connector 6 includes housing 80, which is defined by an upstanding body portion 82 having side walls 84, 86, a lower face 88 for receipt on a printed circuit board, and a mating face at 90. As shown in FIG. 5, upper and lower extension portions 92 and 94 extend from the body portion 82 to define the mating face 90. A recessed face 96 is defined between the upper and lower extensions 92, 94 at the front face of the body portion 82. Finally, as shown best in FIG. 8, circuit card receiving slots 100 and 102 extend inwardly from front faces 90 of each of the respective upper and lower extensions 92, 94, and extend inwardly to the housing body 80.

Figure 7:
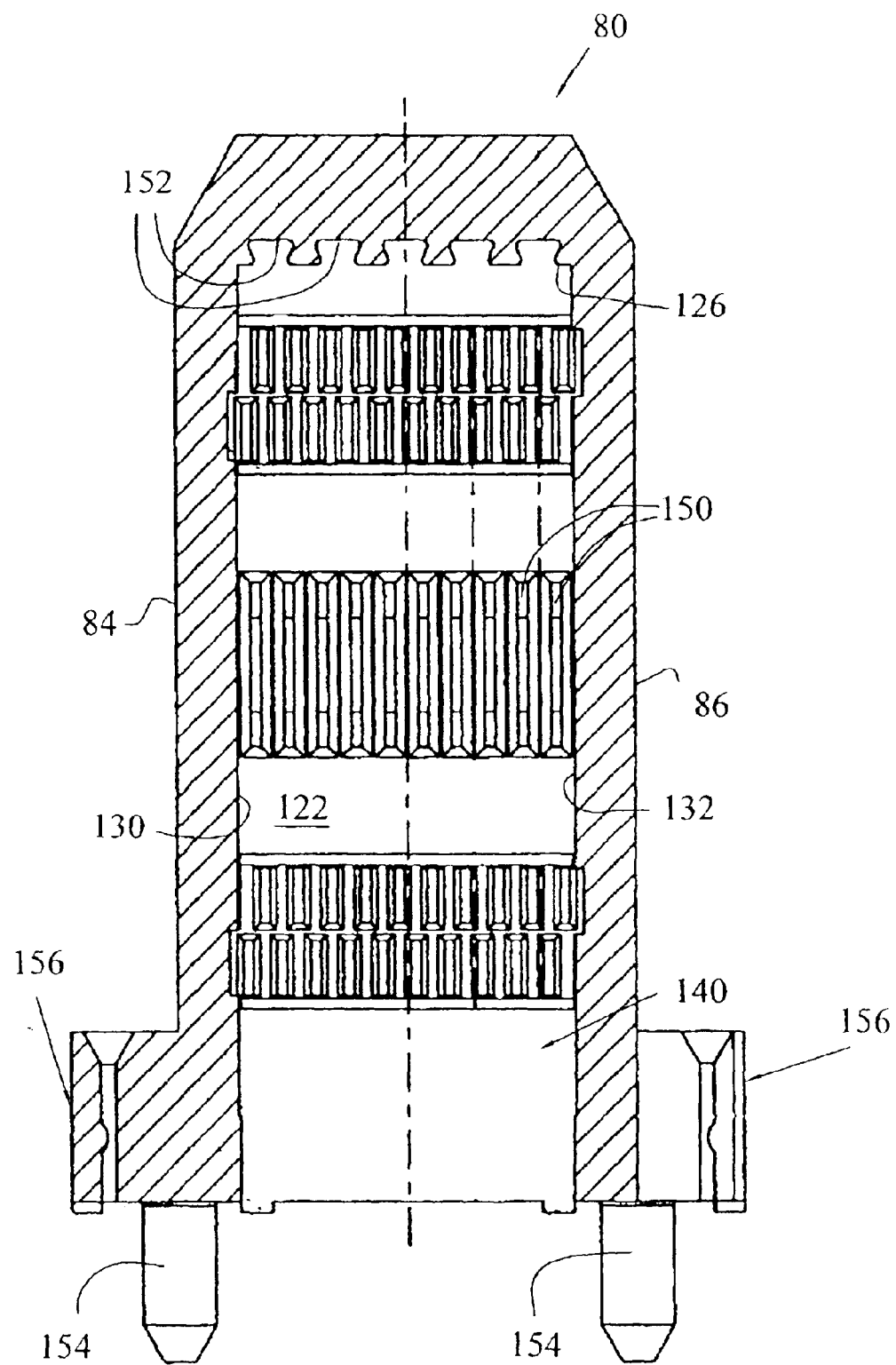
FIG. 7 is a cross-sectional view through lines 7—7 of FIG. 6.
Figure 8:
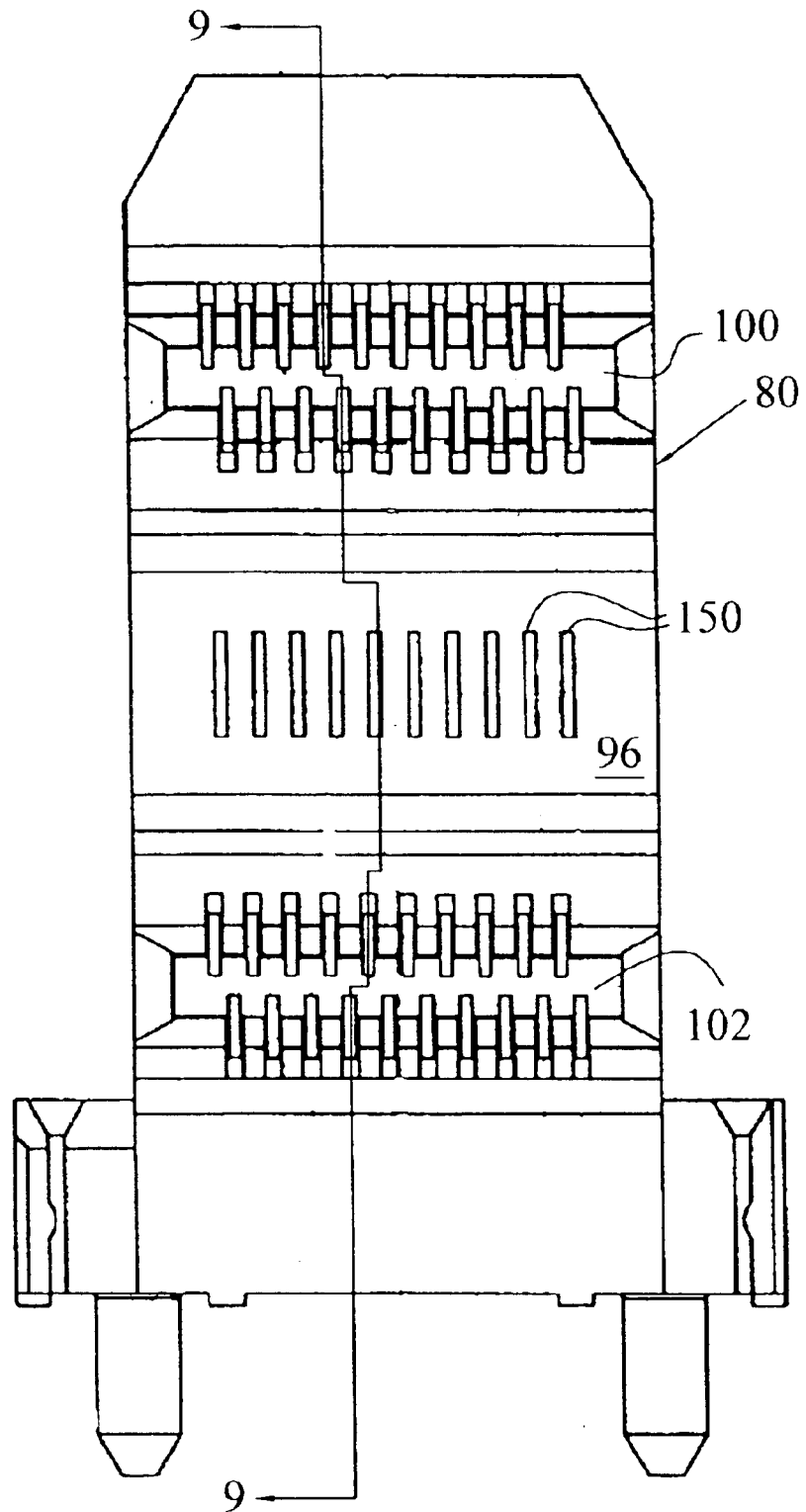
FIG. 8 is a front plan view of the connector of FIG. 5.
Figure 9:
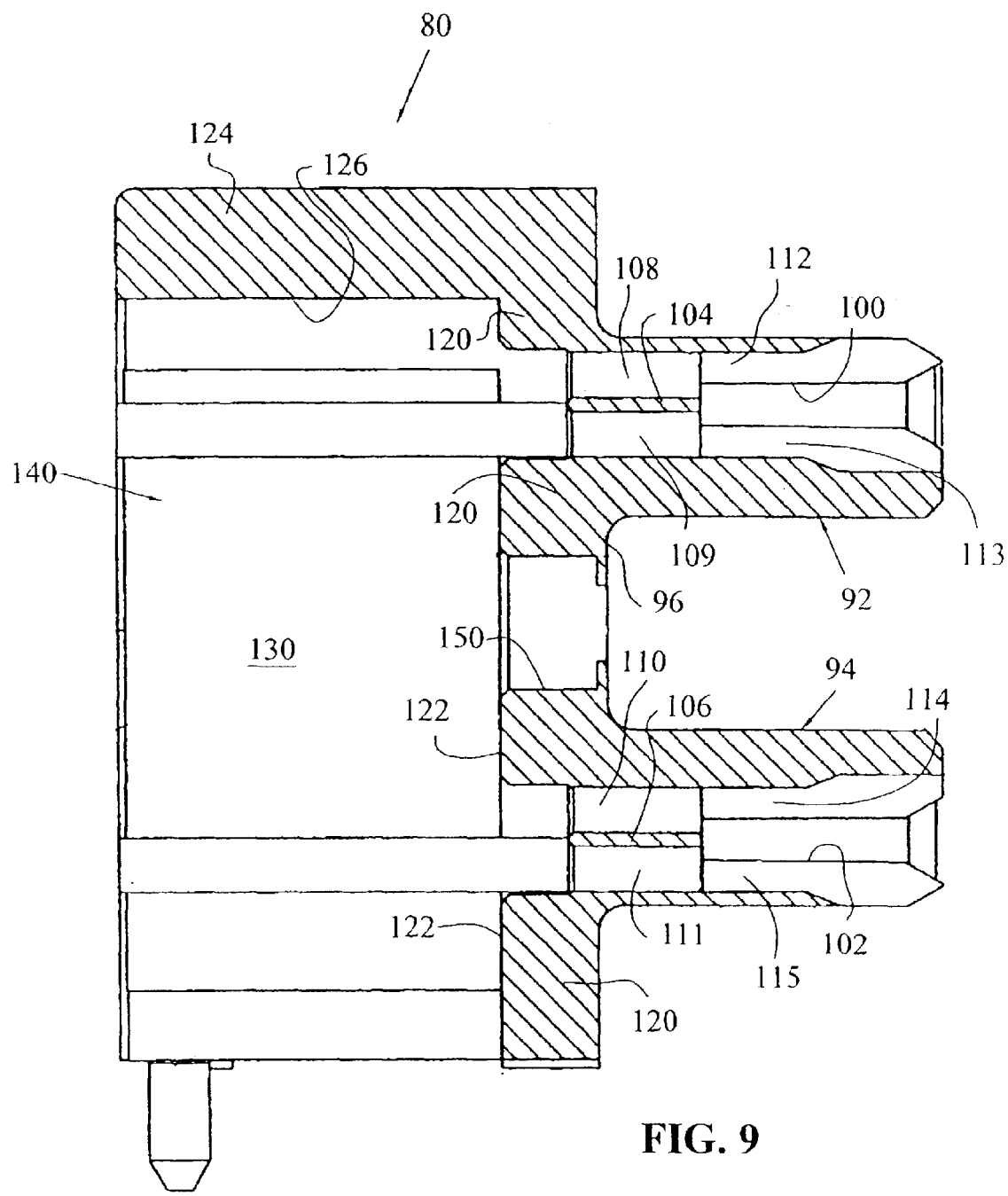
FIG. 9 is a cross-sectional view through lines 9—9 of FIG. 8.

With reference now to FIGS. 7 through 9, the interior of the housing will be described in greater detail. With reference first to FIG. 9, the interior of the cavity is shown in greater detail. It should first be noted that FIG. 9 is a staggered cross section through each of the contact cavities as shown in FIG. 8, such that each of the cavities is shown in cross section. As shown, slots 100 and 102 extend inwardly into their respective extensions 92, 100 rearwardly to respective intermediate walls 104, 106, thereby defining upper and lower terminal-receiving passageways 108–111 in each of the upper and lower extensions. As also shown in FIG. 9, passageways 108–111 are aligned with slots 112–115, respectively, which flank the slots 100, 102 and which open on to the front face 90. As also shown best in FIG. 9, extensions 92 and 94 extend from a front wall section 120, which defines an inner surface at 122. Housing 80 also includes a top wall portion 124 defining an inner surface at 126. Furthermore, as best shown in FIG. 7, side walls 84 and 86 define inner surfaces 130 and 132. Thus, a rear cavity 140 is defined in housing 80, rearward of central wall 120, bounded by surfaces 122, 126 and inner surfaces 130, 132. It should be appreciated that this cavity 140 is defined for the receipt of terminal modules, as will be described in greater detail.

With respect to the terminal module, housing 80 includes a plurality of locking slots 150, which extend through the recessed face 96, as best shown in FIGS. 5 and 8, and extend inwardly through wall 20 to surface 22, as best shown in FIGS. 7 and 9. Furthermore, as shown in FIG. 7, housing 80 includes a plurality of dove-tail slots 152 positioned within upper surface 126 for aligning the modules, as will be described herein. The connector housing 80 also includes aligning posts 154 and latching members 156. Latches 156 are positioned on opposite corners of the housing, as best shown in FIGS. 5 and 7. Latches 156 are profiled for slidable receipt over edges of divider plates 30, and over edges of side walls 14 and 16, as will be described further herein.

Figure 10:
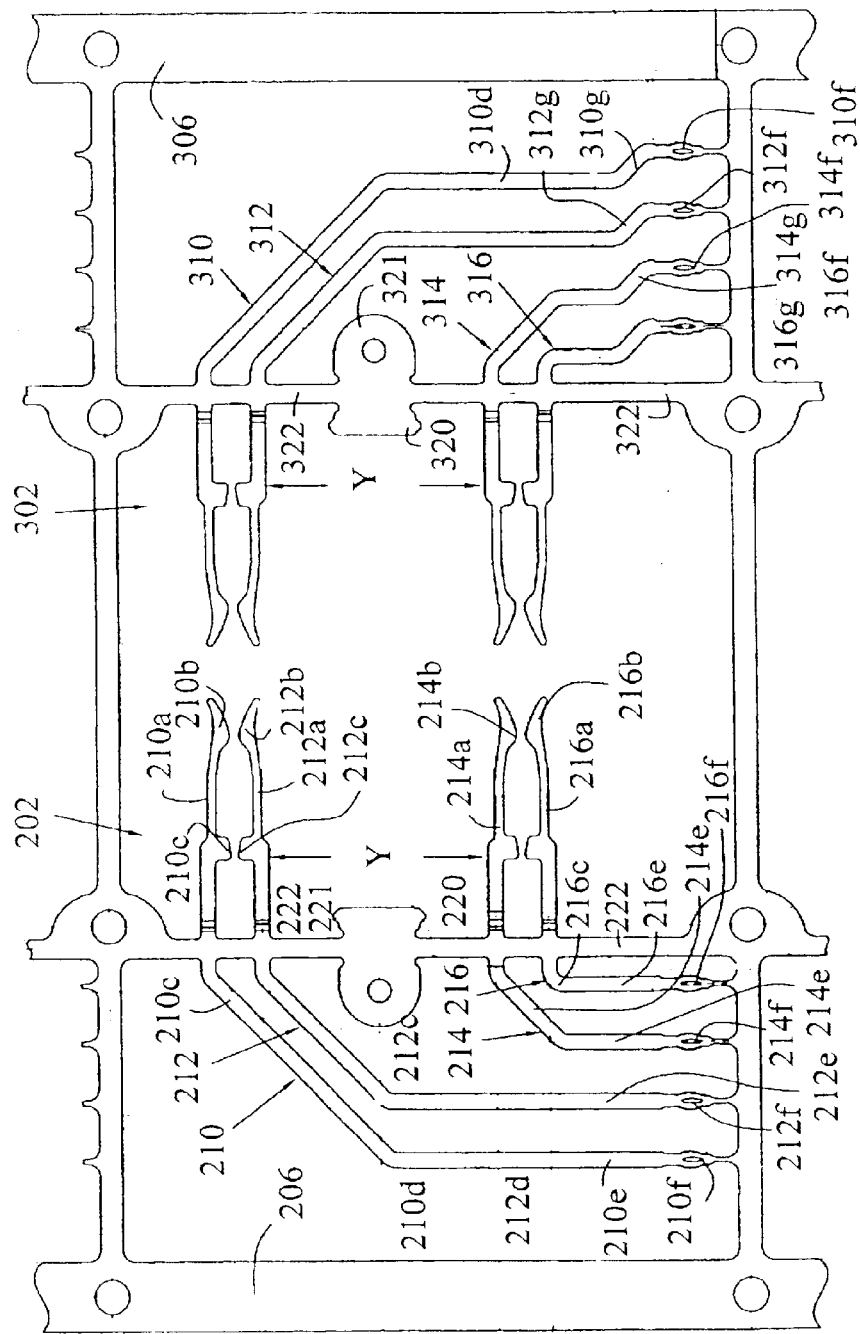
FIG. 10 is a top plan view of the stamped and formed lead frame which form adjacent contacts for the housing of FIG. 5.

With respect now to FIGS. 10 through 12B, the terminal modules will be described in greater detail. With respect first to FIGS. 12A and 12B, two terminal modules 200 and 300 are shown where each of the modules generally includes a terminal lead frame 202 and 302, overmolded by a web of plastic material 204 and 304. As shown best in FIG. 10, lead frames 202 and 302 are shown stamped from a common sheet of material which can be carried by carrier strips 206, 306. Each terminal set 202, 302 is comprised of four terminals, an upper pair of terminals 210, 212; 310, 312; and a lower set of terminals 214, 216; 314, 316. As shown in FIG. 10, the upper and lower pairs are separated by a vertical distance Y, and retention tabs 220, 320 are positioned in that vertical spacing and held in place by a carrier strip portion 222, 322, respectively.

Each of the pairs of terminals are virtually identical, yet are mirror images of each other, as will be described herein. Terminal 210 includes a cantilever beam section 210a defining a forward contact section 210b adjacent a front end of the terminal. Terminal 210 further includes a locking tab portion 210c. Terminal 210 further includes an intermediate angled portion 210c, which transitions the terminal from a horizontal to a vertical position, and transitions into an elongate extension portion at 210d, which compensates for the horizontal spacing Y and which is interconnected to compliant pin portion at 210e. As shown in FIG. 10, each of the terminals has equivalent components, with the exception that terminals 214 and 216 do not have elongate extension portions such as 210d and 212d, rather, terminals 214 and 216 have intermediate portions 214c, 216c, respectively, which transition generally into printed circuit board portions 214e, 216e.

As shown in FIG. 10, terminal lead frame 302 is virtually identical to lead frame 202, with the exception that each of the terminals includes a kinked leg portion 310g–316g, which generally steps the compliant pin portions 310f–316f rearwardly, relative to the corresponding compliant pin portions 210f–216f, respectively.

Figure 11:
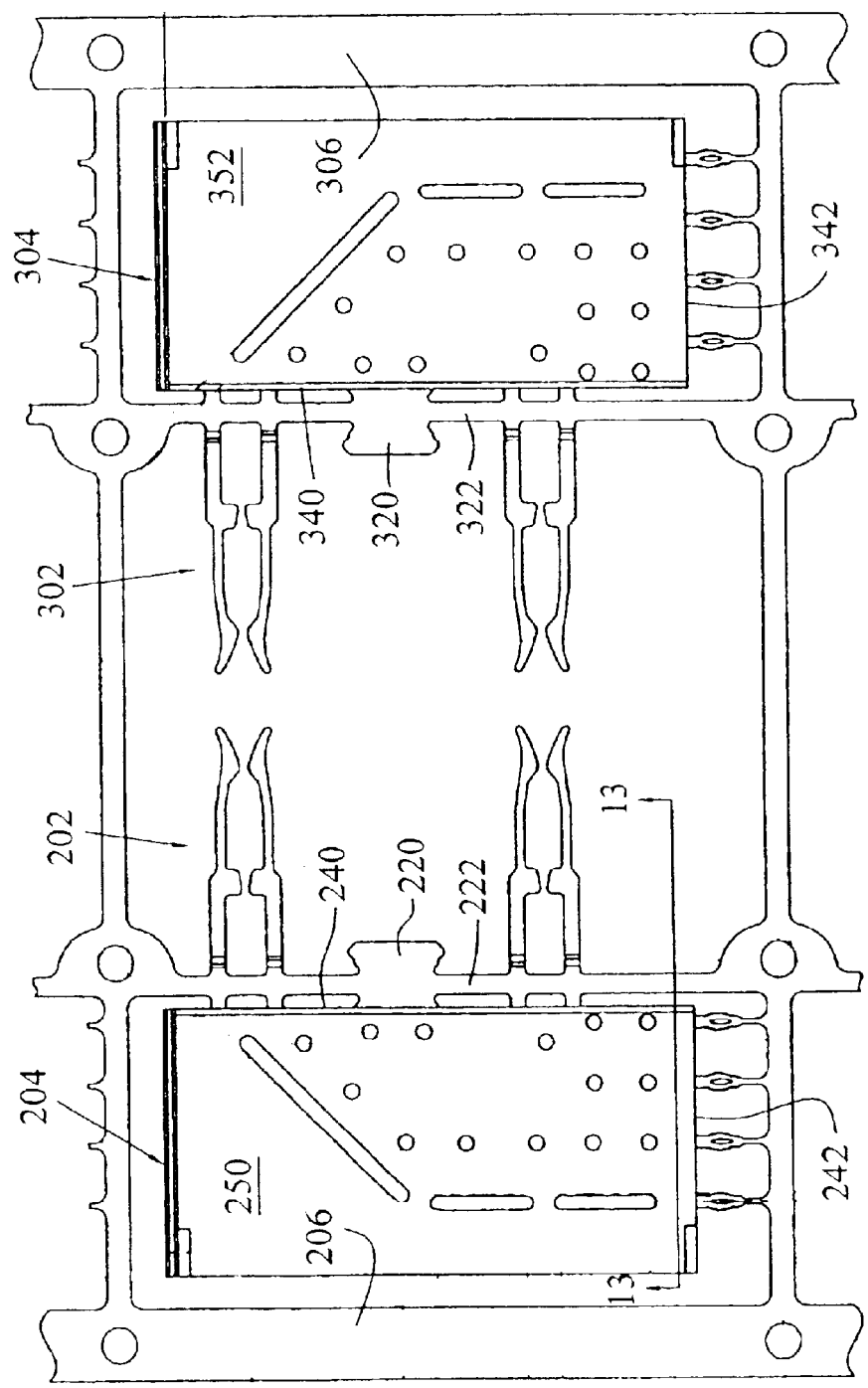
FIG. 11 is a view showing the molded, insulated web of material overmolded on the lead frame of FIG. 10.
Figure 12B:
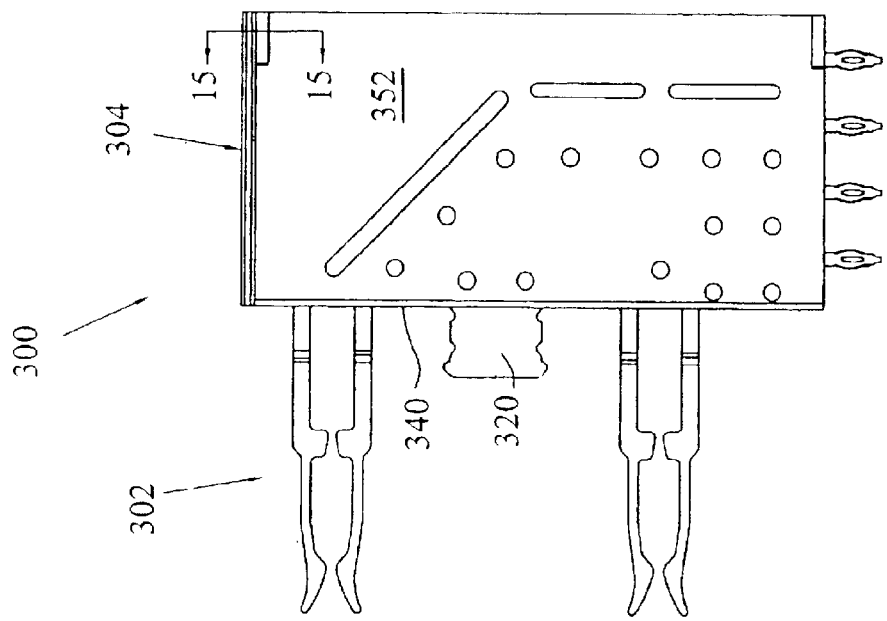
FIGS. 12A and 12B show the terminal subassemblies removed from the lead frame of FIG. 11.
Figure 12A:
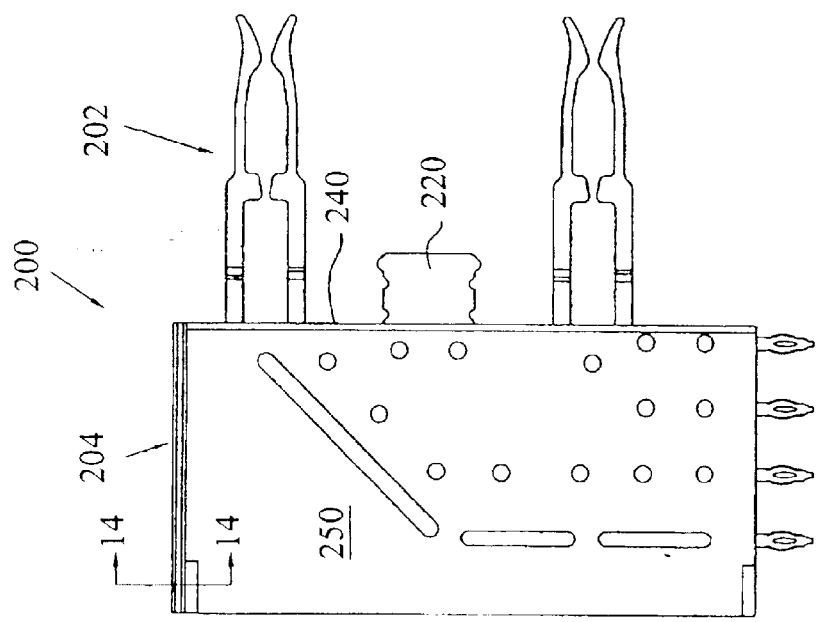

With respect now to FIG. 11, with the lead frame as shown and described in FIG. 10, molded webs 204, 304 are insert-molded over a portion of the lead frame, leaving the cantilever beam portions of each of the terminals extending forwardly from front edges 240, 340, respectively, of the molded webs. In a similar nature, the compliant pin portions 210f–216f extend downwardly from a lower edge 242, 342 of the molded webs 204, 304. As shown in FIGS. 10 and 11, each of the tab portions 220, 320 includes an eyelet portion, 221, 321 which is overmolded adjacent the front edges 240, 340, yet the forward portion of the tabs 220, 320 extends outwardly from the front edge. When the overmolded webs 204, 304 are placed in the position shown in FIG. 11, lead frames 206, 306; and 222, 322 can be stamped free from the lead frame, thereby defining the completed inserts as shown in FIGS. 12A and 12B as 200 and 300, respectively.

Figure 14:
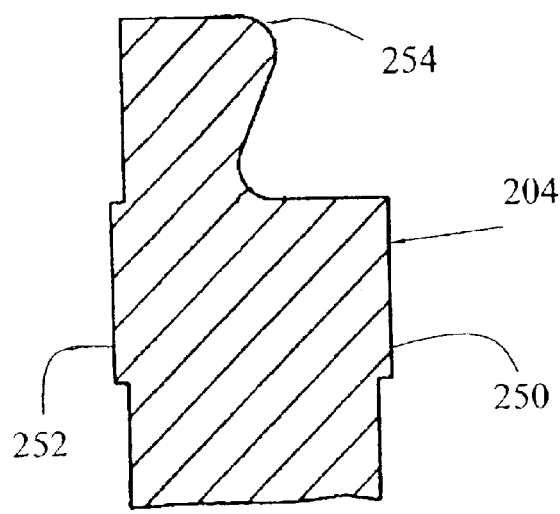
FIG. 14 is a cross-sectional view through lines 14—14 of FIG. 12A.
Figure 15:
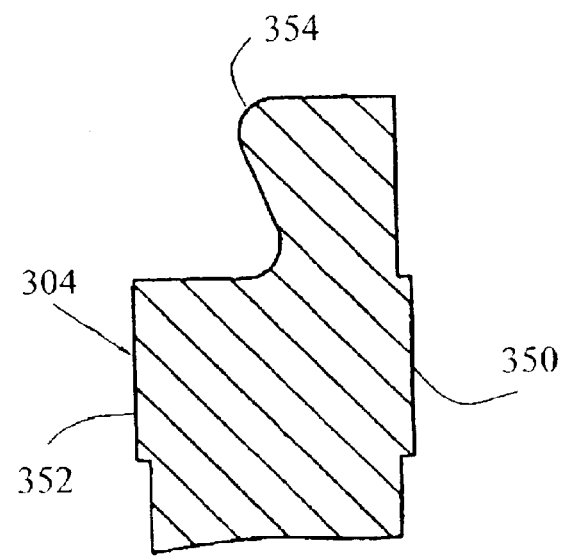
FIG. 15 is a cross-sectional view through lines 15—15 of FIG. 12B.

With reference now to FIG. 13, the configuration of the cantilever beam terminals 214a and 216a is shown in greater detail. As shown, each of the terminals is kinked at 214h and 216h to stagger the cantilever portions 214a and 216a. Furthermore, as shown in FIG. 13, the web 204 includes side surfaces 250, 252, whereas molded insert 304 includes side surfaces 350, 352 (FIGS. 12B, 15). As shown best in FIGS. 14 and 15, the top edge of the molded inserts are also configured as cooperative dove-tail portions, such that, when molded inserts 204 and 304 are positioned in a stacked relation, with surface 252 of insert 204 positioned against surface 350 of insert 304, the two profiles 254 and 354 provide a dove-tail tongue configuration. It should be appreciated that this tongue configuration is profiled as the dove-tail slot 152, as shown in FIG. 7. With the components as described above, the assembly of the connector assembly and the connector assembly to the cage will now be described.

Figure 16:
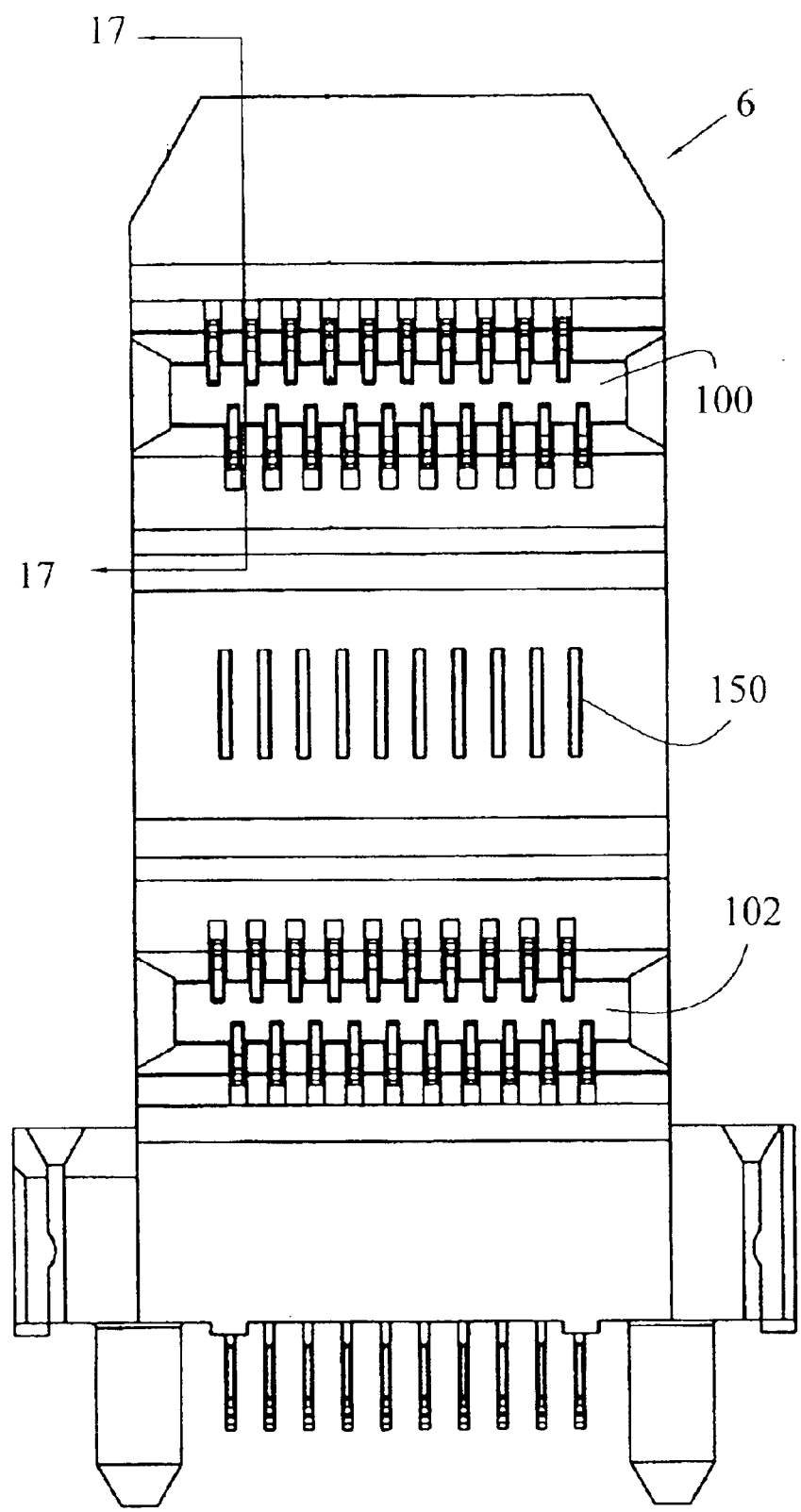
FIG. 16 is a front plan view of the assembled connector.
Figure 18:
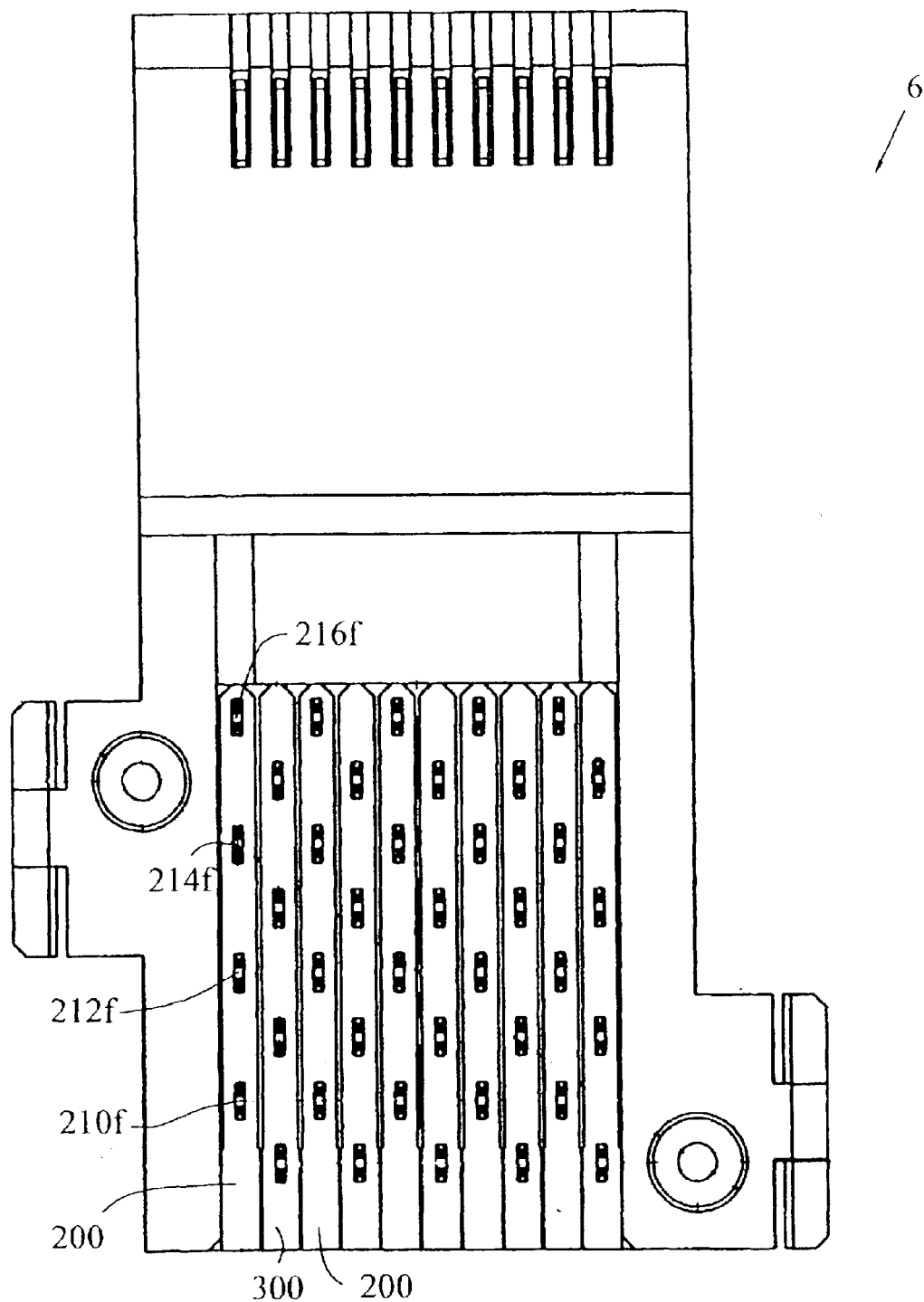
FIG. 18 is a lower plan view of the assembled connector of FIG. 16.

As mentioned above, each of the terminal subassemblies 200, 300 are positioned stacked one against the other, with surface 350 of molded insert 304 positioned against surface 252 of molded insert 204. These molded inserts may now be inserted into the cavity portion 140 of housing 80, such that the individual terminals align with respective passageways 108–111. Continued movement of the inserts into the housing causes the terminals to be positioned within respective slots 112–115 (FIG. 9). A continued force causes locking tabs 220, 320 to be inserted into slot 150, thereby locking the inserts in place with the front edge 240 of the molded inserts positioning molding inserts 204, 304 fully positioned within the cavity, with surfaces 240, 340 against inner surface 122 of housing 80. As also mentioned above, the dove-tail configuration 254, 354 allows alignment of the individual arrays with the dovetail slots 152. The cantilever beams are positioned within housing 80, whereby tab portions (such as 210c) are interference fit within the respective passageway 108, and the tab portion 210c acts as a fulcrum with the cantilever beam portion 210a extending forwardly, with a portion of beam 210a in slot 212, and the contact point 210b extending into the receiving slot 100. It should be appreciated that each of the cantilever beams is so situated in their respective passageways and slots. Thus, the fully assembled configuration of connector 6 is shown in FIGS. 16 and 18.

Figure 19:
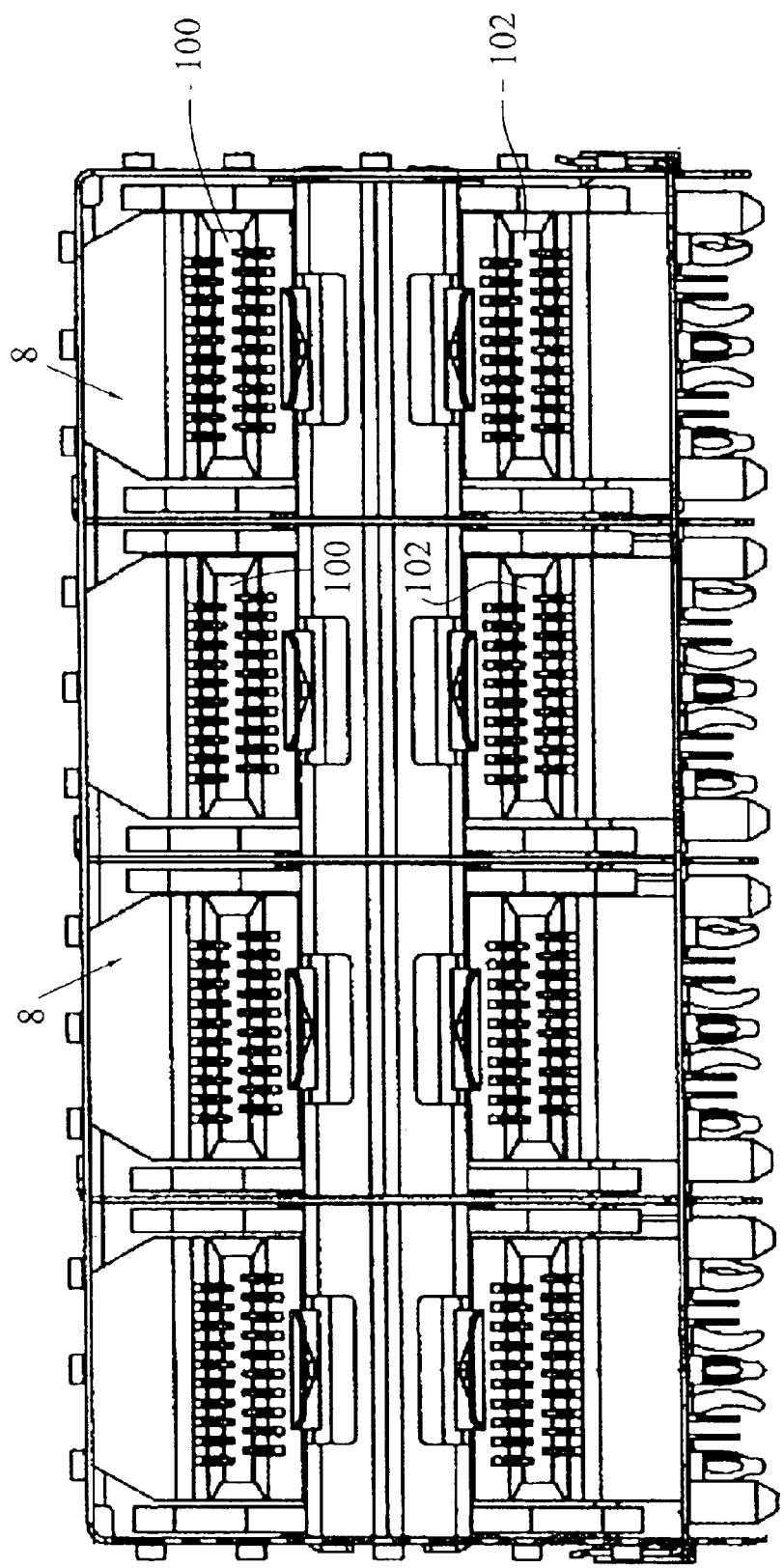
FIG. 19 is a front plan view showing the connectors in place within the cage.

Connector 6 can now be positioned within the cage member, through floor portion 12 to the position shown in FIGS. 1, 2 and 19. As best shown in FIG. 2, each of the connectors is shown clipped to the cage member, whereby latches 156 in opposite corners of the connector are clipped to either an outside wall 14, 16 or an internal divider wall 30. As shown best in FIG. 2, due to its staggered configuration of the latches 156, the connector housings 80 can be positioned in a closely aligned array. As also shown best in FIG. 19, each of the printed circuit card receiving slots 100, 102 are aligned within the port openings 8 for receipt of a module.

Figure 20:
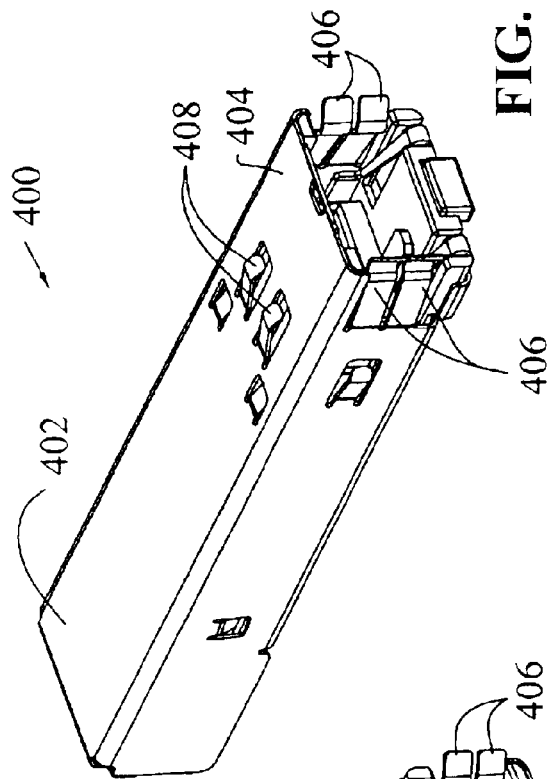
FIGS. 20 and 21 show perspective views of a module for receipt within the cage of FIG. 1 and for interconnection with the connector.
Figure 21:
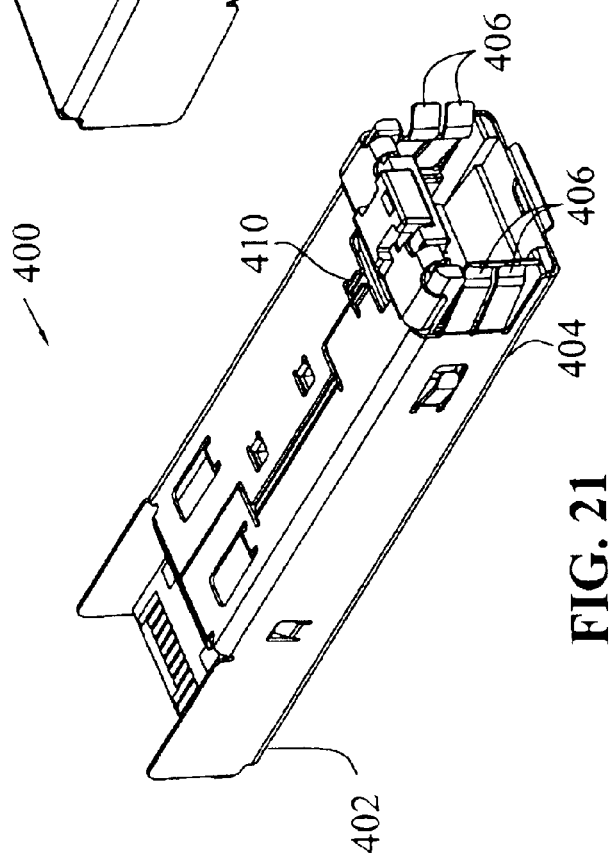

Finally, as shown in FIGS. 20 and 21, a small form-factor pluggable (SFP) module is shown at 400 having a circuit card at one end 402 thereof for interconnection into slots 100, 102 and into interconnection with the plurality of electrical terminals is shown. The module 400 would further include an electrical interconnection within the module to an interface at end 404, such as a copper interface in the way of a modular jack, or to a fiber optic connector for further interfacing. The module would also include grounding tabs such as 406, 408, and a raised embossment at 410 (FIG. 21). This embossment would latch into triangular shaped openings 54 (FIG. 1) of the grounding tabs 52. This allows for easy extraction of the modules 400 as the grounding tabs are accessible from the front end of the cage. These SFP modules are similar to those known as Tyco Part Number 1367251 and as shown in U.S. Pat. No. 6,517,382, incorporated herein by reference.

Advantageously, the assembly of the entire electrical connector assembly is simplified by the availability of the connector header 4 having interconnectability vis-à-vis two printed circuit card receiving slots 100, 102, which further increases the port density and efficiency of the overall system.

What is claimed is:

1. An electrical connector, comprising:
    an insulative housing having an upstanding body, having a lower printed circuit receiving face and a mating face, said mating face comprising upper and lower printed circuit card receiving slots, said receiving slots extending horizontally across said face, and being positioned one above the other; and
    a terminal array comprised of a stamped lead frame overmolded with a web of plastic material, each said array comprising:
    upper and lower terminals pairs, with an upper pair comprised of cantilever beam contacts flanking said upper printed circuit card receiving slot, and a lower pair comprised of cantilever beam contacts flanking said lower printed circuit card receiving slot;
    said terminals within said pairs being positioned proximate each other, and said pairs being spaced apart from each other by a vertical spacing;
    each said terminal of said lower pair having an intermediate portion transitioning into a printed circuit board portion; and
    each said terminal of said upper pair having an intermediate portion transitioning into an extension portion, and then into said printed circuit board portion.

2. The connector of claim 1, wherein said housing includes upper and lower extensions which extend from a body portion of said connector housing to said front mating face, said upper and lower printed circuit card receiving slots being positioned in respective upper and lower extensions.

3. The connector of claim 2, wherein said body portion defines a recessed face, intermediate said upper and lower extensions.

4. The connector of clam 3, wherein said overmolded web of material is substantially rectangular in configuration, having a front vertical edge positioned with said upper and lower pair of cantilevered beam contacts extending outwardly from said front edge, and a lower horizontal edge having said printed circuit board contacts extending outwardly therefrom.

5. The connector of claim 4, wherein said cantilever beam contacts of said upper and lower pairs are laterally staggered relative to each other, and extend laterally staggered over said upper and lower printed circuit card receiving slots.

6. The connector of claim 4, further comprising a locking tab overmolded in said web of material, said locking tab being positioned in said vertical spacing, and extends outwardly from said front edge thereof, said locking tab engaging a slot in said recessed face of said housing.

7. The connector of claim 6, wherein said locking tab is formed from the same material as said stamped lead frame, but is stamped free from said terminals.

8. The connector of claim 4, wherein said housing includes a cavity behind said recessed face and said upper and lower extensions, to receive a plurality of stacked terminal arrays.

9. The connector of claim 8, wherein each said overmolded web of material includes substantially planar side surfaces, to allow the stacking of said terminal arrays.

10. The connector of claim 9, further comprising cooperative aligning elements on adjacent stacked terminal arrays.

11. The connector of claim 10, wherein said cooperative elements are defined by a cooperative dovetail being positioned on said adjacent stacked terminal arrays, which are received in receiving slots formed on an upper surface of said cavity.

12. An electrical connector assembly, comprising:
a shielding cage comprised of a plurality of ports defined in an array of a plurality of rows and columns, said shielding cage having a front mating face, side walls, a top wall, a rear wall, and a partially extending lower wall and intermediate wall, forming a communication opening between a column of vertical ports; and
an electrical connector, comprising an insulative housing having an upstanding body, said electrical connector being receivable in said communication opening and having a lower printed circuit receiving face and a mating face, said mating facing comprising upper and lower printed circuit card receiving slots, said receiving slots extending horizontally across said face, and being positioned one above the other, and each being generally aligned with one of said ports in said column, and a plurality of terminals defined in an array, with each said array comprising upper and lower terminals pairs, with an upper pair comprised of cantilever beam contacts flanking said upper printed circuit card receiving slot, and a lower pair comprised of cantilever beam contacts flanking said lower printed circuit card receiving slot.

13. The connector assembly of claim 12, further comprising a plurality of pluggable modules, receivable in at least some of said ports, said module having a printed circuit card adjacent a pluggable end of said modules and being positionable with said slots and engageable with said terminal pairs, and an interface connector at a front end, said interface connector being accessible through said port when said module is plugged in, said interface connector and said printed circuit card being electrically interconnected.

14. The connector assembly of claim 13, wherein said shielding cage includes adjacent said front mating face, tabs having latching openings therein, and said modules have complementary latching embossments for engagement with said openings for latching said modules in place.

15. The connector assembly of claim 12, wherein said a terminal array is comprised of a stamped lead frame overmolded with a web of plastic material, each said array comprising upper and lower terminals pairs, with an upper pair comprised of cantilever beam contacts flanking said upper printed circuit card receiving slot, and a lower pair comprised of cantilever beam contacts flanking said lower printed circuit card receiving slot.

16. The connector assembly of claim 15, wherein said terminals within said pairs are positioned proximate each other, and said pairs being spaced apart from each other by a vertical spacing, and each said terminal of said lower pair having an intermediate portion transitioning into a printed circuit board portion; and each said terminal of said upper pair having an intermediate portion transitioning into an extension portion, and then into said printed circuit board portion.

17. The connector assembly of claim 15, wherein said housing includes upper and lower extensions which extend from a body portion of said connector housing to said front mating face, said upper and lower printed circuit card receiving slots being positioned in respective upper and lower extensions.

18. The connector assembly of claim 17, wherein said body portion defines a recessed face, intermediate said upper and lower extensions.

19. The connector assembly of clam 18, wherein said overmolded web of material is substantially rectangular in configuration, having a front vertical edge positioned with said upper and lower pair of cantilevered beam contacts extending outwardly from said front edge, and a lower horizontal edge having said printed circuit board contacts extending outwardly therefrom.

20. The connector assembly of claim 19, wherein said cantilever beam contacts of said upper and lower pairs are laterally staggered relative to each other, and extend laterally staggered over said upper and lower printed circuit card receiving slots.

21. The connector assembly of claim 20, further comprising a locking tab overmolded in said web of material, said locking tab being positioned in said vertical spacing, and extends outwardly from said front edge thereof, said locking tab engaging a slot in said recessed face of said housing.

22. The connector assembly of claim 21, wherein said locking tab is formed from the same material as said stamped lead frame, but is stamped free from said terminals.

23. The connector assembly of claim 22, wherein said housing includes an cavity behind said recessed face and said upper and lower extensions, to receive a plurality of stacked terminal arrays.

24. The connector assembly of claim 23, wherein each said overmolded web of material includes substantially planar side surfaces, to allow the stacking of said terminal arrays.

25. The connector assembly of claim 24 further comprising cooperative aligining elements on adjacent stacked terminal arrays.

26. The connector assembly of claim 25, wherein said cooperative elements are defined by a cooperative dovetail being positioned on said adjacent stacked terminal arrays, which are received in receiving slots formed on an upper surface of said cavity.

* * * * *